(12) United States Patent
Sato et al.

(10) Patent No.: US 10,304,704 B2
(45) Date of Patent: May 28, 2019

(54) SUBSTRATE PROCESSING METHOD AND SUBSTRATE PROCESSING APPARATUS

(71) Applicant: Toshiba Memory Corporation, Minato-ku (JP)

(72) Inventors: Katsuhiro Sato, Yokkaichi (JP); Junichi Igarashi, Nagoya (JP); Yoshihiro Ogawa, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 255 days.

(21) Appl. No.: 15/046,781

(22) Filed: Feb. 18, 2016

(65) Prior Publication Data

US 2017/0062244 A1   Mar. 2, 2017

(30) Foreign Application Priority Data

Aug. 26, 2015  (JP) ................................ 2015-167037

(51) Int. Cl.
*F26B 5/14*    (2006.01)
*H01L 21/67*   (2006.01)
*H01L 21/02*   (2006.01)

(52) U.S. Cl.
CPC .. *H01L 21/67051* (2013.01); *H01L 21/02057* (2013.01); *H01L 21/67028* (2013.01)

(58) Field of Classification Search
CPC ......... H01L 21/67028; H01L 21/67034; H01L 21/67051; F26B 5/08; F26B 11/08
USPC ...................................................... 34/397
See application file for complete search history.

(56) References Cited

U.S. PATENT DOCUMENTS

| 5,864,966 | A | * | 2/1999 | Singletery ......... H01L 21/67034 34/517 |
| 6,960,372 | B2 | | 11/2005 | Motomura |
| 8,375,887 | B2 | | 2/2013 | Takayanagi et al. |
| 9,162,247 | B2 | | 10/2015 | Yoshihara et al. |
| 9,213,242 | B2 | | 12/2015 | Uozumi et al. |
| 2003/0064159 | A1 | | 4/2003 | Motomura |
| 2005/0091874 | A1 | * | 5/2005 | Chen ................. H01L 21/02063 34/445 |
| 2008/0078426 | A1 | * | 4/2008 | Miya ................. H01L 21/67028 134/95.2 |
| 2010/0227056 | A1 | | 9/2010 | Takayanagi et al. |
| 2012/0073599 | A1 | | 3/2012 | Miya et al. |
| 2012/0276753 | A1 | | 11/2012 | Yoshihara et al. |

(Continued)

FOREIGN PATENT DOCUMENTS

| JP | 9-190996 | 7/1997 |
| JP | 10-135180 | 5/1998 |

(Continued)

*Primary Examiner* — John P McCormack
(74) *Attorney, Agent, or Firm* — Oblon, McClelland, Maier & Neustadt, L.L.P.

(57) ABSTRACT

A substrate processing method according to an embodiment is a substrate processing method for drying a substrate. The substrate processing method includes supplying a solution in which a sublimation material is dissolved in a first solvent to a surface of a cleaned substrate. The substrate processing method includes eliminating at least a portion of association states of the sublimation material. The substrate processing method includes precipitating the sublimation material on the surface of the substrate. The substrate processing method includes removing the precipitated sublimation material by sublimation.

20 Claims, 10 Drawing Sheets

(56) References Cited

U.S. PATENT DOCUMENTS

| | | | |
|---|---|---|---|
| 2013/0008868 A1* | 1/2013 | Uozumi | G03F 7/162 |
| | | | 216/41 |
| 2013/0074764 A1 | 3/2013 | Ishihara et al. | |
| 2013/0256603 A1* | 10/2013 | Chesterfield | H01L 51/0007 |
| | | | 252/500 |
| 2015/0091075 A1 | 4/2015 | Nishitani et al. | |
| 2015/0155159 A1 | 6/2015 | Igarashi et al. | |
| 2015/0273535 A1 | 10/2015 | Sato et al. | |
| 2015/0277225 A1* | 10/2015 | Kojima | G03F 7/0045 |
| | | | 430/18 |
| 2017/0178892 A1 | 6/2017 | Sato | |
| 2017/0250094 A1* | 8/2017 | Verhaverbeke | H01L 21/67034 |

FOREIGN PATENT DOCUMENTS

| | | |
|---|---|---|
| JP | 2003-112099 | 4/2003 |
| JP | 2008-10638 | 1/2008 |
| JP | 2010-206019 | 9/2010 |
| JP | 2012-74564 | 4/2012 |
| JP | 2012-238838 | 12/2012 |
| JP | 2012-243869 | 12/2012 |
| JP | 2013-16699 | 1/2013 |
| JP | 2013-33817 | 2/2013 |
| JP | 2013-42093 | 2/2013 |
| JP | 2013-42094 | 2/2013 |
| JP | 2013-69952 | 4/2013 |
| JP | 2013-258272 | 12/2013 |
| JP | 2015-50414 | 3/2015 |
| JP | 5681560 | 3/2015 |
| JP | 2015-88732 | 5/2015 |
| JP | 2015-92619 | 5/2015 |
| JP | 2015-106645 | 6/2015 |
| JP | 2015-185713 | 10/2015 |
| JP | 2016-25233 A | 2/2016 |
| JP | 2016-32063 A | 3/2016 |
| JP | 2016-96317 A | 5/2016 |
| JP | 2017-112220 A | 6/2017 |

* cited by examiner

SUBSTRATE PROCESSING METHOD AND SUBSTRATE PROCESSING APPARATUS

CROSS REFERENCE TO RELATED APPLICATIONS

This application is based upon and claims the benefit of priority from the prior Japanese Patent Application No. 2015-167037, filed on Aug. 26, 2015, the entire contents of which are incorporated herein by reference.

FIELD

Embodiments relate to a substrate processing method and a substrate processing apparatus.

BACKGROUND

In a manufacturing process of an electronic component, processing residues or surface contaminants adhering to a substrate are removed by a wet cleaning process. In the wet cleaning process, a water-based cleaning solution is supplied to a surface of a substrate, rinsing with pure water is performed, and thereafter the surface of the substrate is dried. A pattern formed on the substrate has become finer in recent years, and there are problems such that the pattern is collapsed by a surface tension of a liquid when the substrate is dried after the wet cleaning process.

A known drying method for preventing collapse of a pattern is a drying method that uses sublimation of a sublimation material to dry a surface of a substrate (hereinafter, also "sublimation drying"). In the sublimation drying, a solution containing a sublimation material is spin-coated onto a surface of a substrate, and a solvent is removed from the spin-coated solution to precipitate the sublimation material. The precipitated sublimation material is changed from a solid phase to a gas phase (sublimation), so that the sublimation material is removed from the surface of the substrate.

The sublimation drying uses a solution in which a low molecular organic material is dissolved in a highly volatile solvent, as a sublimation material containing liquid. However, the sublimation material containing liquid has a low viscosity that is 50 cP or less, and its solute is a low molecular material unlike a resist material and a SOG (Spin on Glass) material. Therefore, there is a problem of film formability. Due to this, unevenness in micron order in film formation is generated in the conventional sublimation drying, and this unevenness in film formation may cause collapse or deformation of the pattern on the surface of the substrate.

DETAILED DESCRIPTION

A substrate processing method according to an embodiment is a substrate processing method for drying a substrate. The substrate processing method includes supplying a solution in which a sublimation material is dissolved in a first solvent to a surface of a cleaned substrate. The substrate processing method includes eliminating at least a portion of association states of the sublimation material. The substrate processing method includes precipitating the sublimation material on the surface of the substrate. The substrate processing method includes removing the precipitated sublimation material by sublimation.

Embodiments will now be explained with reference to the accompanying drawings. The present invention is not limited to the embodiments.

DETAILED DESCRIPTION

First Embodiment

First, an embodiment is described as a first embodiment, in which a rotation acceleration of a semiconductor substrate is changed, so that an association state of a sublimation material in a sublimation material containing liquid is eliminated. The association state of the sublimation material herein refers to a state where molecules or ions of the sublimation material form aggregates, that is, micelles by intermolecular forces or the like.

The sublimation material containing liquid is a solution in which a sublimation material as an organic material that is solid at a normal temperature and pressure and has a vapor pressure of 100 Pa or less at a normal temperature is dissolved in a first solvent that is volatile. The sublimation material containing liquid is not particularly limited, so long as it can form a film of a sublimation material. For example, as the sublimation material, a lower molecular compound is more preferable than a higher molecular compound, and an aromatic compound and a cyclic compound are preferable. It is more preferable that the sublimation material is an aromatic compound having a polar functional group or a cyclic compound having a polar functional group. For example, benzoic acid derivative, phthalic acid derivative, phenol derivative, benzophenone derivative, cyclohexanecarboxylic-acid derivative, benzamide derivative, and aniline derivative are considered. Further, the sublimation material may be a compound having a methyl ester group. The first solvent is not particularly limited, so long as a rinsing liquid described later can be replaced with the first solvent. In a case of using pure water as the rinsing liquid, for example, the first solvent can be methanol, ethanol, IPA (that is, 2-propanol), cyclohexanone, acetone, or tetrahydrofuran, for example. Other than those, the first solvent can be PGMEA (propylene glycol-1-monomethyl ether acetate) or NMP (N-methylpyrrolidone), for example.

Figure 1:
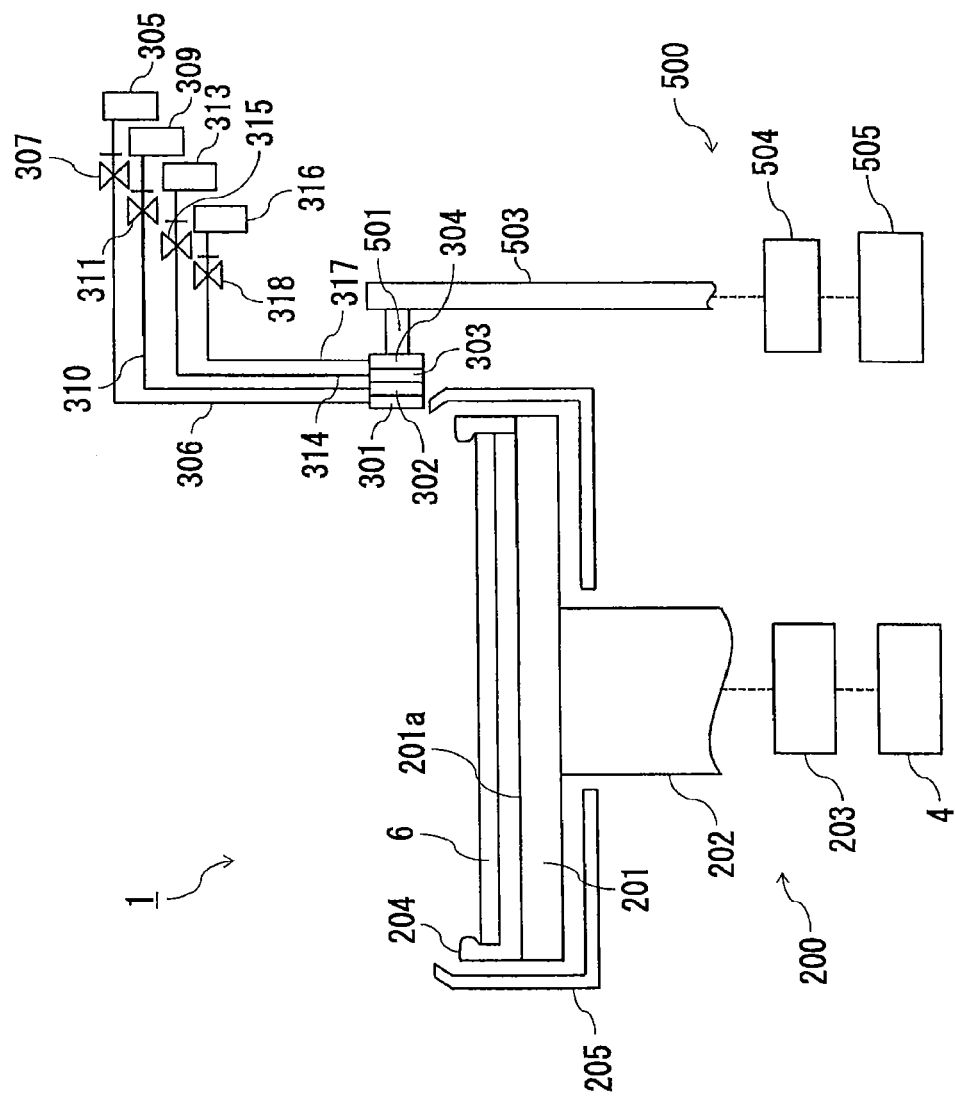
FIG. 1 is a diagram of a substrate processing apparatus according to a first embodiment.

FIG. 1 is a diagram of a substrate processing apparatus 1 according to the first embodiment. The substrate processing apparatus 1 includes a rotating mechanism 200 that is an example of a rotator, a plurality of nozzles 301 to 304, a first controller 4 that is an example of an association eliminator, and a moving device 500. The rotating mechanism 200 and the first controller 4 also function as a precipitator.

The rotating mechanism 200 has a horizontal stage 201 having a circular plate shape. The stage 201 is fixed to a top end of a vertically extending rotation shaft 202 to be coaxial with the rotation shaft 202. The stage 201 can be rotated around the rotation shaft 202. A driving source 203, such as a motor, is connected to the rotation shaft 202. The driving source 203 drives and rotates the rotation shaft 202. The first controller 4 described above is connected to the driving source 203. The first controller 4 is constituted by a driver circuit, a CPU, and the like, for example. The first controller 4 controls driving and rotation of the rotation shaft 202 by the driving source 203. The first controller 4 changes a rotation acceleration of the stage 201, that is, a centrifugal acceleration, as described later. By changing the rotation acceleration, the first controller 4 can apply a shear force to a sublimation material containing liquid supplied to a surface of a semiconductor substrate 6. In this manner, the first controller 4 eliminates an association state of the sublimation material in a sublimation material containing liquid.

A plurality of chuck pins 204 are arranged on an outer circumferential edge of a surface 201a of the stage 201 with circumferential intervals therebetween. The chuck pins 204 fix the semiconductor substrate 6 onto the stage 201 horizontally by grasping an outer circumferential surface of the semiconductor substrate 6. With this configuration, the rotating mechanism 200 can rotate the semiconductor substrate 6 while the semiconductor substrate 6 is fixed above the stage 201.

A cup 205 having a substantially cylindrical shape being coaxial with the stage 201 is provided around the stage 201. A top end portion of the cup 205 is located at a higher level than the chuck pins 204. The cup 205 prevents a liquid on the surface of the semiconductor substrate 6 from being scattered to the surroundings by rotation of the rotating mechanism 200 during cleaning, rinsing, and drying described later, for example.

The first nozzle 301 is connected to a tank 305 storing a chemical liquid therein via a supply pipe 306. The supply pipe 306 is provided with a valve 307 that adjusts a flow rate of the chemical liquid. The first nozzle 301 discharges a cleaning chemical liquid to the surface of the semiconductor substrate 6. The first nozzle 301 is movable between a standby position away from the semiconductor substrate 6 and a supply position above the surface of the semiconductor substrate 6. Although the first nozzle 301 cleans the semiconductor substrate 6 in a single sheet manner, the first embodiment can be also applied for drying the semiconductor substrate 6 cleaned in a batch manner. In a case of batch cleaning the semiconductor substrate 6, a chemical liquid tank can be provided in place of the first nozzle 301.

The second nozzle 302 is connected to a tank 309 storing a rinsing liquid therein via a supply pipe 310. The rinsing liquid is pure water, for example. The supply pipe 310 is provided with a valve 311 that adjusts a flow rate of the rinsing liquid. The second nozzle 302 is movable between the supply position and the standby position similarly to the first nozzle 301. The second nozzle 302 discharges the rinsing liquid supplied from the tank 309 to the surface of the semiconductor substrate 6 cleaned with the chemical liquid. Although the second nozzle 302 rinses the semiconductor substrate 6 in a single sheet manner, the first embodiment can be applied for drying the semiconductor substrate 6 rinsed in a batch manner. In a case of batch rinsing the semiconductor substrate 6, a rinsing liquid tank can be provided in place of the second nozzle 302.

The third nozzle 303 is connected to a tank 313 storing IPA (Iso-Propyl Alcohol) therein via a supply pipe 314. The supply pipe 314 is provided with a valve 315 that adjusts a flow rate of IPA. The third nozzle 303 is movable between the supply position and the standby position similarly to the first nozzle 301. The third nozzle 303 discharges IPA to the surface of the semiconductor substrate 6 processed with the rinsing liquid. The rinsing liquid can be efficiently replaced with IPA. However, the third nozzle 303 is not necessarily provided, because the rinsing liquid can be replaced with a sublimation material containing liquid discharged from the fourth nozzle 304, as described later.

The fourth nozzle 304 is an example of a first supplier. The fourth nozzle 304 is connected to a tank 316 storing a sublimation material containing liquid therein via a supply pipe 317. The supply pipe 317 is provided with a valve 318 that adjusts a flow rate of the sublimation material containing liquid. The fourth nozzle 304 is movable between the supply position and the standby position similarly to the first nozzle 301.

The fourth nozzle 304 discharges the sublimation material containing liquid supplied from the tank 316 to the surface of the semiconductor substrate 6 processed (that is, cleaned) with the rinsing liquid.

The sublimation material containing liquid discharged from the fourth nozzle 304 is applied onto the surface of the semiconductor substrate 6 to spread radially outwards from a center portion of the surface by rotation of the semiconductor substrate 6 accompanying the rotation of the stage 201. The rinsing liquid present on the surface of the semiconductor substrate 6 can be replaced with the sublimation material containing liquid applied onto the surface of the semiconductor substrate 6. In the process of applying the sublimation material containing liquid while rotating the stage 201, the first controller 4 changes a rotation acceleration of the stage 201 to apply a shear force to the sublimation material containing liquid. The shear force can be rephrased as an inertia force towards a direction of resistance to a direction in which the rotation acceleration of the rotating mechanism 200 changes. Applying the shear force can eliminate the association state of the sublimation material in the sublimation material containing liquid. The association state may be eliminated in all molecules or ions of the sublimation material in the sublimation material containing liquid, or in at least a portion of the molecules or the ions. The first solvent volatilizes from the sublimation material containing liquid in which the association state has been eliminated, to precipitate the sublimation material. In this manner, a film of the sublimation material is obtained. The film of the sublimation material is formed in a state where the association state has been eliminated, and therefore there is less unevenness of film formation. A surface pattern of the semiconductor substrate 6, in which the film of the sublimation material with less unevenness of film formation is embedded, is less likely to be collapsed or deformed.

The moving device 500 moves the nozzles 301 to 304 between the supply position and the standby position described above. The moving device 500 may move the nozzles 301 to 304 as one unit or may move them individually. The moving device 500 includes an arm portion 501 connected at one end to the nozzles 301 to 304, a rotation shaft 503 connected to another end of the arm portion 501, a driving source 504 that drives and rotates the rotation shaft 503, and a controller 505 that controls the driving source 504.

As described above, the substrate processing apparatus 1 according to the first embodiment can eliminate an association state of a sublimation material by changing a rotation acceleration of the stage 201 to apply a shear force to a sublimation material containing liquid, when the sublimation material is precipitated. Because the association state can be eliminated, unevenness of film formation can be suppressed so that collapse or deformation of a pattern can be suppressed.

Figure 2:
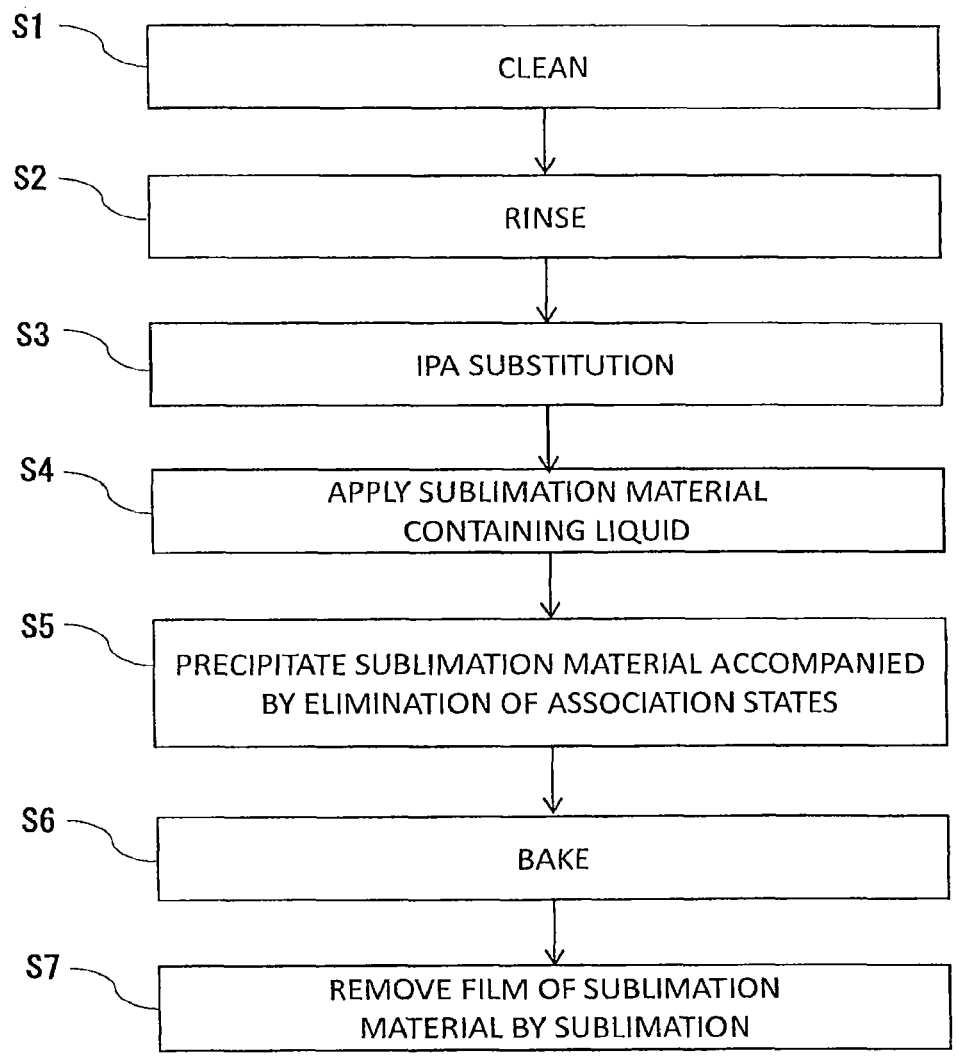
FIG. 2 is a flowchart of a substrate processing method according to the first embodiment.

Next, a substrate processing method to which the substrate processing apparatus 1 of FIG. 1 is applied is described. FIG. 2 is a flowchart of the substrate processing method according to the first embodiment.

Figure 3A:
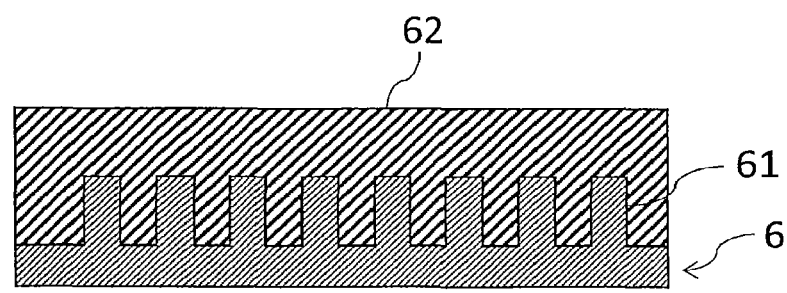
FIG. 3A is a cross-sectional view of the substrate processing method according to the first embodiment.

First, the substrate processing apparatus 1 performs a cleaning process on the semiconductor substrate 6 placed on the stage 201 (Step S1). In the cleaning process, the moving device 500 moves the first nozzle 301 to the supply position, and the first nozzle 301 discharges a chemical liquid to the surface of the semiconductor substrate 6. At this time, the driving source 203 rotates the stage 201. The semiconductor substrate 6 is cleaned while being rotated in association with the rotation of the stage 201. FIG. 3A is a cross-sectional view of the substrate processing method according to the first embodiment. FIG. 3A shows the semiconductor substrate 6 after the cleaning process. As shown in FIG. 3A, a plurality of minute convex patterns 61 are formed with narrow pitches on the surface of the semiconductor substrate 6.

The convex pattern 61 may be a pattern of a memory portion of a NAND flash memory or a pattern of a wiring portion, for example. The structure and the material of the pattern 61 are not particularly limited, so long as the pattern 61 is a minute concave-convex pattern. As a result of the cleaning process, a chemical liquid 62 adheres to the surface of the semiconductor substrate 6. In sublimation drying, this chemical liquid 62 is removed, so that the surface of the semiconductor substrate 6 is dried.

Subsequently, as shown in FIG. 2, the substrate processing apparatus 1 performs a rinsing process of replacing the chemical liquid on the surface of the semiconductor substrate 6 with a rinsing liquid, on the semiconductor substrate 6 after being cleaned (Step S2). In the rinsing process, the moving device 500 moves the second nozzle 302 to the supply position, and the second nozzle 302 discharges a rinsing liquid to the surface of the semiconductor substrate 6. At this time, the driving source 203 rotates the stage 201. The semiconductor substrate 6 is rinsed while being rotated in association with the rotation of the stage 201.

Subsequently, the substrate processing apparatus 1 performs an IPA substitution process on the semiconductor substrate 6 after being rinsed (Step S3). In the IPA substitution process, the moving device 500 moves the third nozzle 303 to the supply position, and the third nozzle 303 discharges IPA to the surface of the substrate. At this time, the driving source 203 rotates the stage 201. The rinsing liquid is replaced with IPA while the semiconductor substrate 6 is rotated in association with the rotation of the stage 201. Note that the IPA substitution process can be omitted if the rinsing liquid can be sufficiently replaced with a sublimation material containing liquid.

Figure 4:
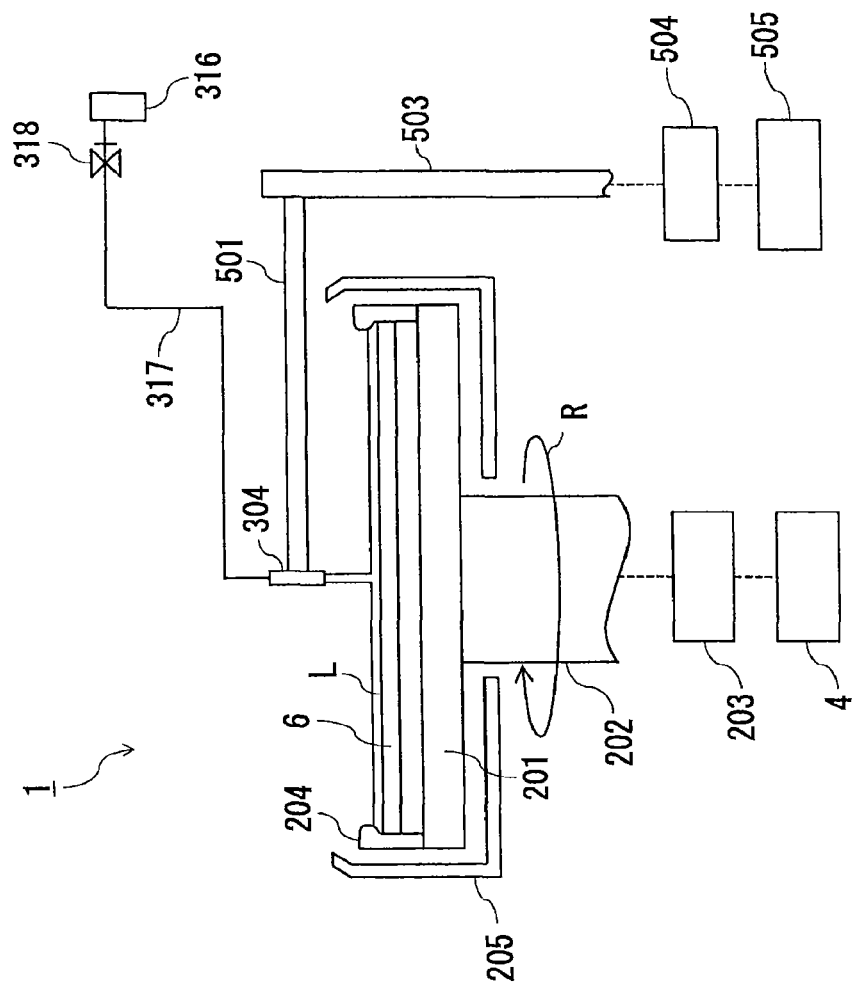
FIG. 4 is a schematic diagram of the substrate processing method according to the first embodiment.

Subsequently, the substrate processing apparatus 1 performs a process of applying a sublimation material containing liquid on the semiconductor substrate 6 after being subjected to the IPA substitution (Step S4). FIG. 4 is a schematic diagram of the substrate processing method according to the first embodiment. As shown in FIG. 4, in the application process, the moving device 500 moves the fourth nozzle 304 to the supply position, and the fourth nozzle 304 discharges a sublimation material containing liquid (denoted by reference character L in FIG. 4) to the surface of the semiconductor substrate 6. At this time, the driving source 203 rotates the stage 201 around the rotation shaft 202 in a direction denoted by reference character R in FIG. 4. The sublimation material containing liquid L is applied radially outwards on the surface of the substrate from the center portion of the surface, in association with the rotation of the stage 201. Due to this application, the rinsing liquid remaining on the surface of the substrate can be efficiently replaced with the sublimation material containing liquid L. After the application process is finished, the moving device 500 moves the nozzles 301 to 304 to the standby position.

Subsequently, as shown in FIG. 2, the substrate processing apparatus 1 performs a process of precipitating a sublimation material accompanied by elimination of an association state of the sublimation material, on the semiconductor substrate 6 after the sublimation material containing liquid L has been applied (Step S5). In the precipitation process, the driving source 203 rotates the stage 201 at a higher speed than in the application process (Step S4). Also, the driving source 203 is controlled by the first controller 4 to change the rotation acceleration of the stage 201. The manner of changing the rotation acceleration is not particularly limited, so long as a shear force is applied to the sublimation material containing liquid. For example, the driving source 203 applies (increases) the rotation acceleration to apply the shear force. Changing the rotation acceleration may be performed only for a certain period of time from start of the precipitation process. Further, increasing and decreasing the rotation acceleration may be repeated over a predetermined period of time to achieve the change of the rotation acceleration.

Furthermore, the rotation acceleration may be changed at the most effective timing based on a volatilization state of a solvent of the sublimation material containing liquid L.

When a large centrifugal force acts on the sublimation material containing liquid by high-speed rotation of the stage 201, the sublimation material containing liquid flows on the surface of the semiconductor substrate 6 radially outwards. Therefore, the sublimation material containing liquid is spun off, and precipitation of the sublimation material, that is, formation of a film of the sublimation material is promoted. Also, the surface of the sublimation material containing liquid is leveled, so that a level difference (undulation) in the surface of the semiconductor substrate 6 is reduced.

Figure 5A:
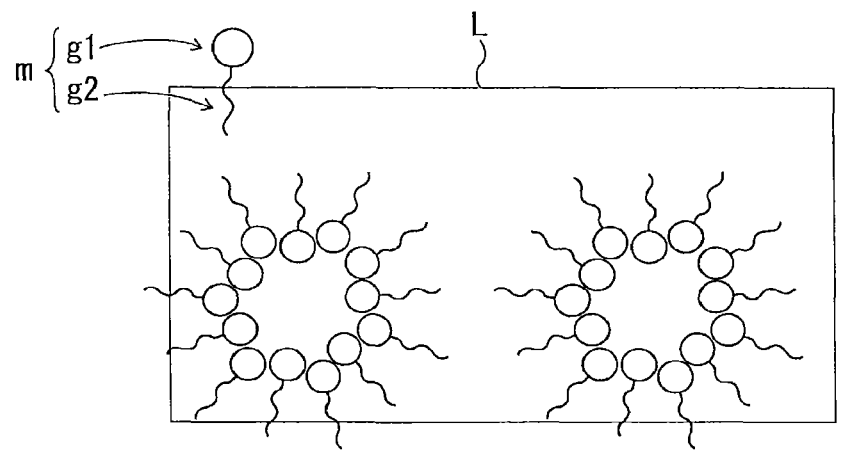
FIG. 5A is a schematic diagram of the substrate processing method according to the first embodiment.
Figure 5B:
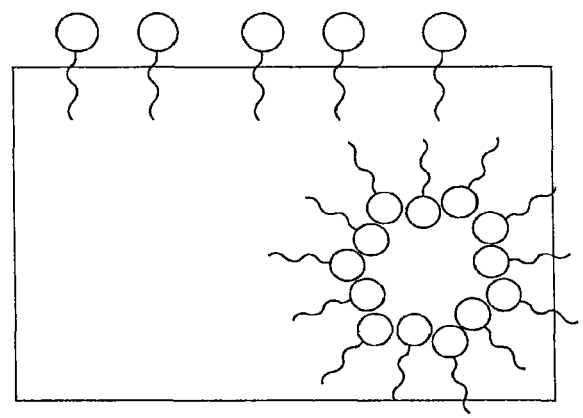
FIG. 5B is a schematic diagram of the substrate processing method following FIG. 5A.

FIG. 5A is a schematic diagram of the substrate processing method according to the first embodiment. FIG. 5B is a schematic diagram of the substrate processing method, following FIG. 5A. FIGS. 5A and 5B show an association state in the sublimation material containing liquid and a state of a surface of the sublimation material containing liquid. In FIGS. 5A and 5B, a sublimation material m is represented by a polar functional group g1 and a hydrophobic group g2. When a shear force is applied to the sublimation material containing liquid by the change of the rotation acceleration of the stage 201, the association state of the sublimation material shown in FIG. 5A is eliminated as shown in FIG.

5B, as in a case of a surfactant. Because of the elimination of the association state, precipitation can be achieved with less unevenness in the sublimation material containing liquid. Although the hydrophobic group g2 faces towards the sublimation material containing liquid L in FIG. 5A, the polar functional group g1 may face towards the sublimation material containing liquid L.

In a case where the sublimation material is precipitated without eliminating the association state and thereafter the surface of the sublimation material is leveled by being dissolved in IPA or the like, the association state can be eliminated in the surface of the sublimation material, but unevenness of film formation of the sublimation material below the surface cannot be eliminated.

On the other hand, according to the first embodiment, it is possible to eliminate the association state before precipitation of the sublimation material. Therefore, the film of the sublimation material can be formed with less unevenness of film formation.

Figure 3B:
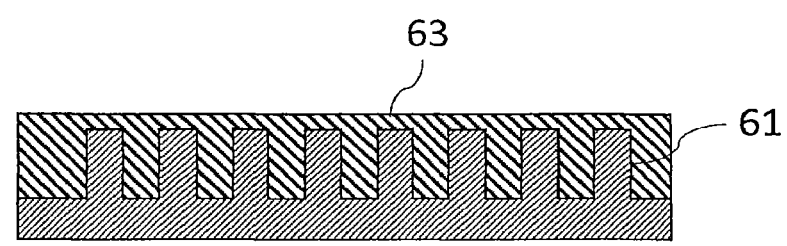
FIG. 3B is a cross-sectional view of the substrate processing method following FIG. 3A.

FIG. 3B is a cross-sectional view of the substrate processing method, following FIG. 3A. FIG. 3B shows the semiconductor substrate 6 after the precipitation process. It is possible to embed a film 63 of the sublimation material between the convex patterns 61 with substantially no unevenness, as shown in FIG. 3B, by performing the precipitation process that accompanies elimination of the association state of the sublimation material.

Figure 3C:
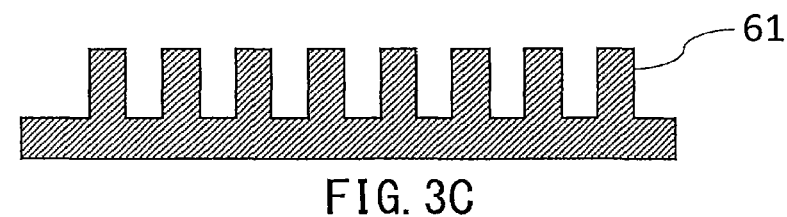
FIG. 3C is a cross-sectional view of the substrate processing method following FIG. 3B.

Subsequently, a baking process using a baking furnace (not shown) is performed on the semiconductor substrate 6 on which the film of the sublimation material has been formed, as shown in FIG. 2 (Step S6). Thereafter, a process of causing sublimation of the film of the sublimation material is performed on the semiconductor substrate 6 after being baked, by using a sublimation device (not shown) (Step S7). In the sublimation process, a temperature and a pressure of the film of the sublimation material are adjusted, so that a phase transition is caused to change the film of the sublimation material directly to gas and to remove the sublimation material from the surface of the substrate. The film of the sublimation material may be removed by being vaporized with plasma. In this manner, drying of the semiconductor substrate 6 is completed. FIG. 3C is a cross-sectional view of the substrate processing method, following FIG. 3B. FIG. 3C shows the semiconductor substrate 6 after the sublimation process. The film 63 of the sublimation material between the convex patterns 61 is removed by the sublimation process as shown in FIG. 3C, and the surface of the semiconductor substrate 6 is dried substantially without collapse or deformation of the convex patterns 61.

As described above, the substrate processing method according to the first embodiment can eliminate an association state of a sublimation material by changing a rotation acceleration of the semiconductor substrate 6 to apply a shear force to a sublimation material containing liquid, when the sublimation material is precipitated. Because the association state can be eliminated, unevenness of film formation can be suppressed and collapse or deformation of the pattern can be suppressed.

The substrate processing method according to the first embodiment can be applied to manufacturing of a device having a convex pattern, for example, a two-dimensional or three-dimensional NAND flash memory and MEMS (Micro Electro Mechanical Systems). It is possible to improve the yield of the device having a convex pattern by applying the substrate processing method according to the first embodiment.

(First Modification)

Next, an example is described as a first modification of the first embodiment, in which a state where an association state of a sublimation material in a sublimation material containing liquid applied onto a surface of the substrate 6 has been eliminated is maintained until precipitation of the sublimation material. In the first modification, constituent parts corresponding to those of the substrate processing apparatus 1 shown in FIG. 1 are denoted by like reference numerals and redundant explanations thereof will be omitted.

Figure 6:
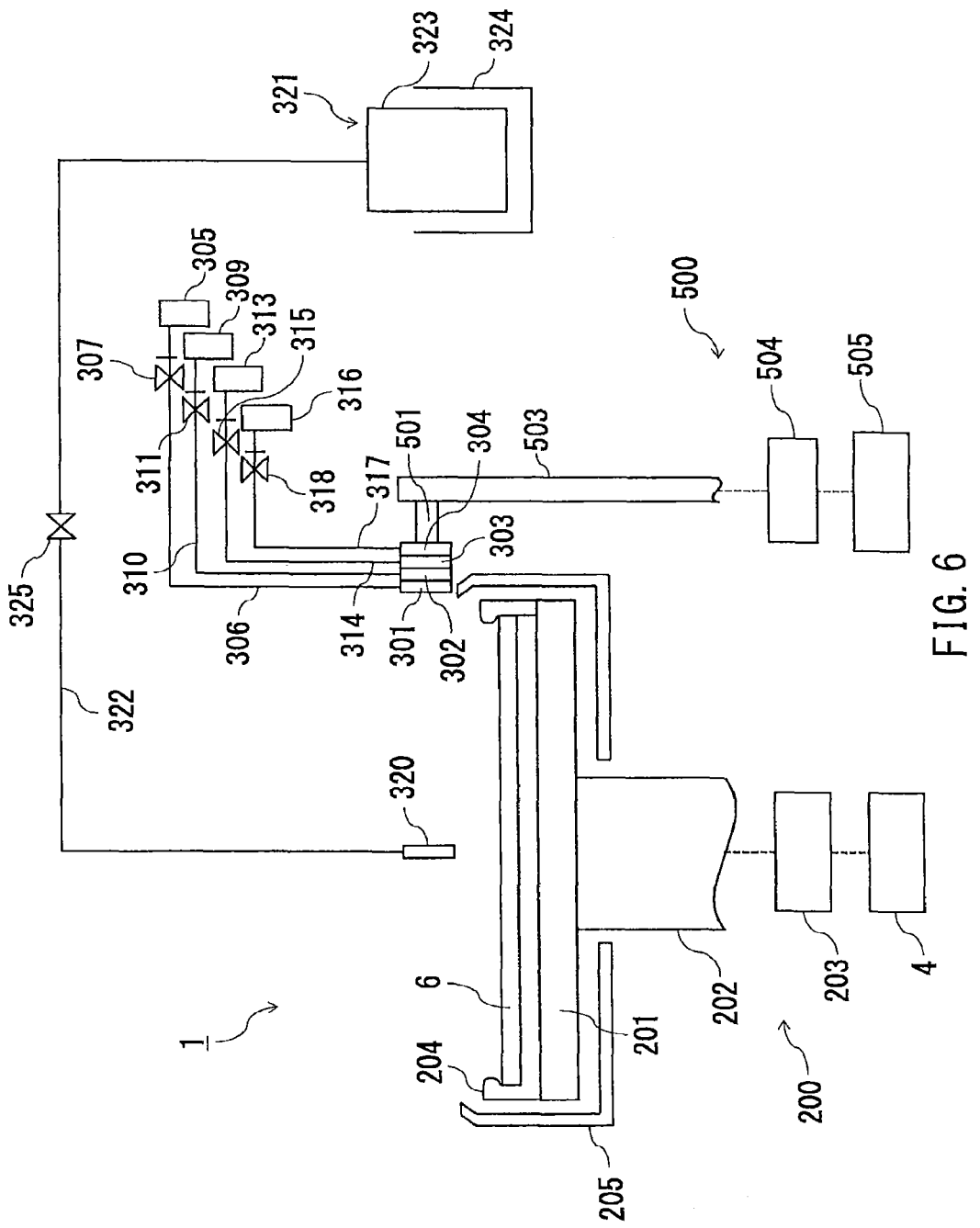
FIG. 6 is a diagram of a substrate processing apparatus according to a first modification of the first embodiment.

FIG. 6 is a diagram of the substrate processing apparatus 1 according to the first modification of the first embodiment. As shown in FIG. 6, the substrate processing apparatus 1 according to the first modification further includes a fifth nozzle 320 as an example of a fourth supplier, in addition to the configuration of the substrate processing apparatus 1 in FIG. 1.

The fifth nozzle 320 is connected to a vapor supply source 321 via a vapor supply pipe 322. The vapor supply source 321 has a solvent tank 323 storing therein a third solvent that can dissolve a sublimation material and a solvent heater 324 for heating the third solvent. The third solvent heated by the solvent heater 324 is evaporated to a vapor. The vapor supply pipe 322 is provided with a vapor supply valve 325 that adjusts a flow rate of the vapor of the third solvent. The fifth nozzle 320 may be movable by a moving device (not shown) between a position opposed to the center portion of the surface of the semiconductor substrate 6 and a position upward away from the surface of the semiconductor substrate 6.

For maintaining the state where the association state of the sublimation material has been eliminated, the fifth nozzle 320 discharges the vapor of the third solvent supplied from the vapor supply source 321 to the surface of the semiconductor substrate 6 to which the sublimation material containing liquid has been supplied. The third solvent is IPA described as an example of the first solvent, for example. IPA is suitable for drying the semiconductor substrate 6 because it can sufficiently dissolve the sublimation material and is excellent in replaceability with a rinsing liquid (pure water).

The third solvent may be a solvent other than the first solvent, so long as it can dissolve the sublimation material. For example, the third solvent may be methanol, ethanol, IPA (that is, 2-propanol), cyclohexanone, acetone, tetrahydrofuran, PGMEA (propylene glycol-1-monomethyl ether acetate), or NMP (N-methylpyrrolidone).

In the configuration of FIG. 1, the association state of the sublimation material can be eliminated by the change of the rotation acceleration of the stage 201. In the first modification, the vapor of the third solvent is brought into contact with the sublimation material containing liquid in which the association state has been eliminated, in the precipitation process (Step S5 in FIG. 2).

By bringing the vapor of the third solvent into contact, it is possible to precipitate the sublimation material while the state where the association state has been eliminated is maintained. Therefore, it is possible to suppress unevenness of film formation further effectively according to the first modification.

(Second Modification)

Next, an example is described as a second modification of the first embodiment, in which a flow speed of an inert gas is controlled. In the second modification, constituent parts corresponding to those of the substrate processing apparatus 1 shown in FIG. 1 are denoted by like reference numerals and redundant explanations thereof will be omitted.

Figure 7:
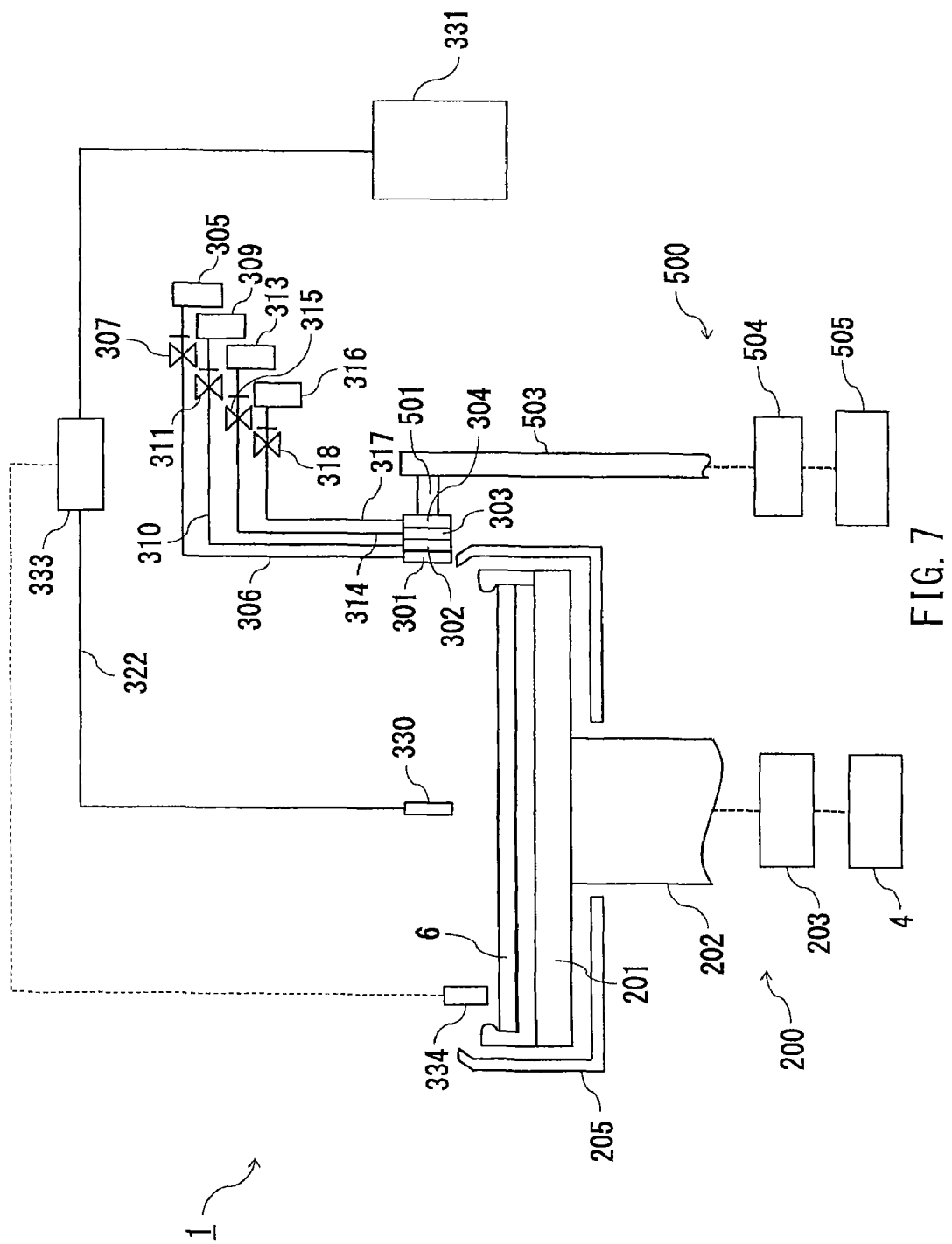
FIG. 7 is a diagram of a substrate processing apparatus according to a second modification of the first embodiment.

FIG. 7 is a diagram of the substrate processing apparatus 1 according to the second modification of the first embodiment. As shown in FIG. 7, the substrate processing apparatus according to the second modification further includes a sixth nozzle 330 as an example of a fifth supplier, in addition to the configuration of the substrate processing apparatus 1 in FIG. 1. The sixth nozzle 330 is connected to a gas source 331 of an inert gas via a supply pipe 332. The inert gas is a gas that does not react with a sublimation material containing liquid, and may be $N_2$ gas, for example. The supply pipe 332 is provided with a mass flow controller 333 that adjusts a flow rate of the inert gas. A concentration meter 334 provided in the cup 205 is connected to the mass flow controller 333. The concentration meter 334 detects a vapor concentration of the first solvent on the semiconductor substrate 6 and outputs detected data of the vapor concentration to the mass flow controller 333. Note that the vapor of the first solvent on the surface of the semiconductor substrate 6 is generated by volatilization of the first solvent in the sublimation material containing liquid.

For controlling the vapor concentration of the first solvent on the semiconductor substrate 6, the mass flow controller 333 controls a flow rate of an inert gas, that is, a flow speed by the sixth nozzle 330 based on the vapor concentration of the first solvent. Specifically, the mass flow controller 333 controls the flow speed of the inert gas at a position 10 mm away from the substrate 6 to a flow speed that can suppress the vapor concentration of the first solvent to be less than a predetermined concentration. For example, the mass flow controller 333 controls the flow speed of the inert gas to be less than 0.8 m/s, to suppress the vapor concentration of the first solvent on the surface of the semiconductor substrate 6 to be less than 1200 ppm. The mass flow controller 333 may suppress the vapor concentration of the first solvent at a position 20 mm away from the surface of the substrate to be less than 1200 ppm.

In the second modification, the inert gas is brought into contact with the sublimation material containing liquid to evaporate the first solvent in the precipitation process (Step S5 in FIG. 2) for promoting the precipitation of the sublimation material. Meanwhile, in a case of bringing the inert gas into contact with the sublimation material containing liquid only for the purpose of promoting the precipitation of the sublimation material, the flow speed of the inert gas is set to be excessively large in some cases. In those cases, the vapor concentration of the first solvent on the semiconductor substrate 6, that is, the amount of volatilization of the first solvent from the sublimation material containing liquid is excessively large. When the vapor concentration of the first solvent is excessively large, the dimension of a Bénard cells on which the magnitude of unevenness of film formation is reflected becomes large. For example, when the flow speed of the inert gas is 1.0 m/s, the vapor concentration of the first solvent on the surface of the semiconductor substrate 6 is 2050 ppm and the dimension of the Bénard cells reaches 10 µm or more. Further, the inert gas comes into direct contact with the sublimation material containing liquid L applied onto the surface of the substrate 6, resulting in generation of unevenness of film formation in a different mode.

On the other hand, in the second modification, the inert gas is brought into contact with the sublimation material containing liquid at such a flow speed that the vapor concentration of the first solvent is less than a predetermined concentration, in order not only to promote the precipitation of the sublimation material but also to control the vapor concentration of the first solvent. Therefore, the dimension of the Bénard cells can be made small. For example, when the flow speed of the inert gas is 0.5 m/s, the vapor concentration of the first solvent on the surface of the semiconductor substrate 6 is 760 ppm, and the dimension of the Bénard cells can be suppressed to 2 µm or less. In a case where the association state of the sublimation material is eliminated by controlling the vapor concentration of the first solvent to be less than the predetermined concentration, a configuration of eliminating the association state with a shear force can be deleted from the configuration of FIG. 7, or may be used in combination.

Therefore, it is possible to further effectively suppress unevenness of film formation by controlling a flow speed of an inert gas according to the second modification.

Second Embodiment

Next, an embodiment in which a second solvent different from the first solvent is added to a sublimation material containing liquid is described as a second embodiment. In explaining the second embodiment, constituent parts corresponding to those of the substrate processing apparatus 1 shown in FIG. 1 are denoted by like reference numerals and redundant explanations thereof will be omitted.

In the second embodiment, a second solvent different from the first solvent is added into the sublimation material containing liquid in the precipitation process (Step S5 in FIG. 2). The second solvent is water, for example. Addition of the second solvent may be performed with the nozzle 302 described in FIG. 1.

Figure 8:
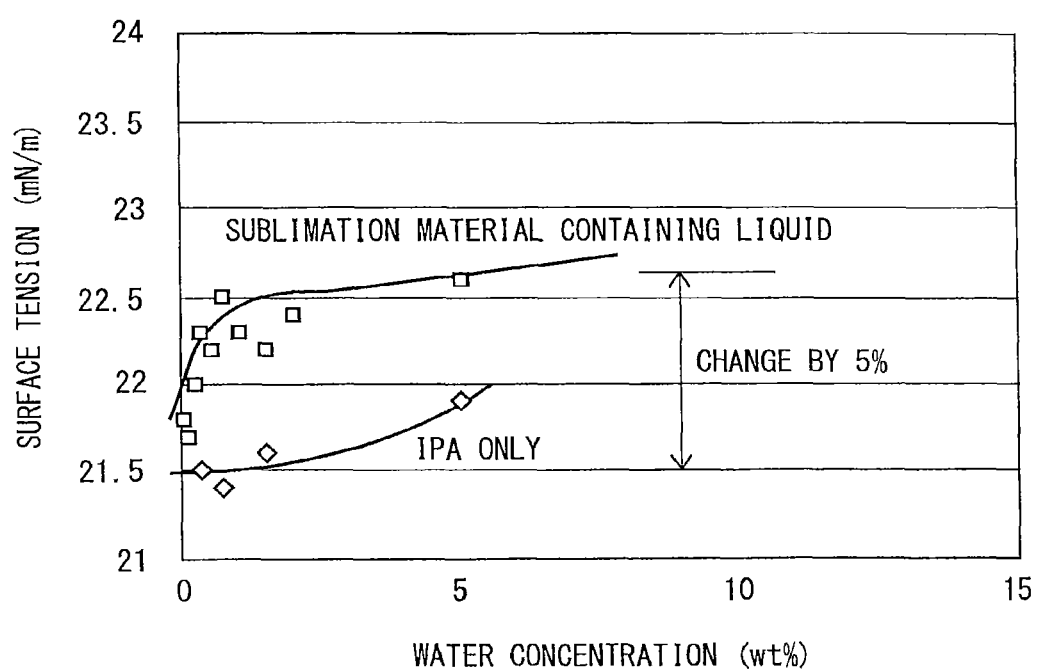
FIG. 8 is a graph showing an experimental example in a second embodiment.

FIG. 8 is a graph showing an experimental example in the second embodiment. The horizontal axis in FIG. 8 represents a water concentration (wt %) in the sublimation material containing liquid. The vertical axis in FIG. 8 represents a surface tension (mN/m) of the sublimation material containing liquid.

In the experimental example, IPA was used as the first solvent of the sublimation material containing liquid. Further, water was used as the second solvent in the experimental example. The surface tension of the sublimation material containing liquid depending on the water concentration in the sublimation material containing liquid was measured in the experimental example. As shown in FIG. 8, as the water concentration in the sublimation material containing liquid increases, the surface tension of the sublimation material containing liquid also increases. The surface tension of IPA is 21.5 mN/m, and the increase in the surface tension means that the association state of the sublimation material in IPA is eliminated and the sublimation material is collected in the surface of IPA. That is, the state in FIG. 5A changes to the state in FIG. 5B. According to the experimental example, it can be considered that addition of water into the sublimation material containing liquid causes elimination of an association state of the sublimation material by an interaction between the sublimation material and the water, and film formability is improved. Preferably, the water is added to the sublimation material containing liquid to increase (change) the surface tension of the sublimation material containing liquid by a range of 1% to 10%. It is shown in FIG. 8 that addition of the water that can achieve 5 wt % of the water concentration can increase the surface tension by 5%. Increasing the surface tension by the range of 1% to 10% can effectively improve the film formability while suppressing the added amount of water.

Therefore, according to the second embodiment, because an association state of a sublimation material can be eliminated by addition of a second solvent to a sublimation material containing liquid, unevenness of film formation can be suppressed similarly to the first embodiment.

Third Embodiment

Next, an embodiment in which a vapor of a second solvent is brought into contact with a sublimation material containing liquid is described as a third embodiment. In explaining the third embodiment, constituent parts corresponding to those of the substrate processing apparatus 1 shown in FIG. 1 are denoted by like reference numerals and redundant explanations thereof will be omitted.

Figure 9:
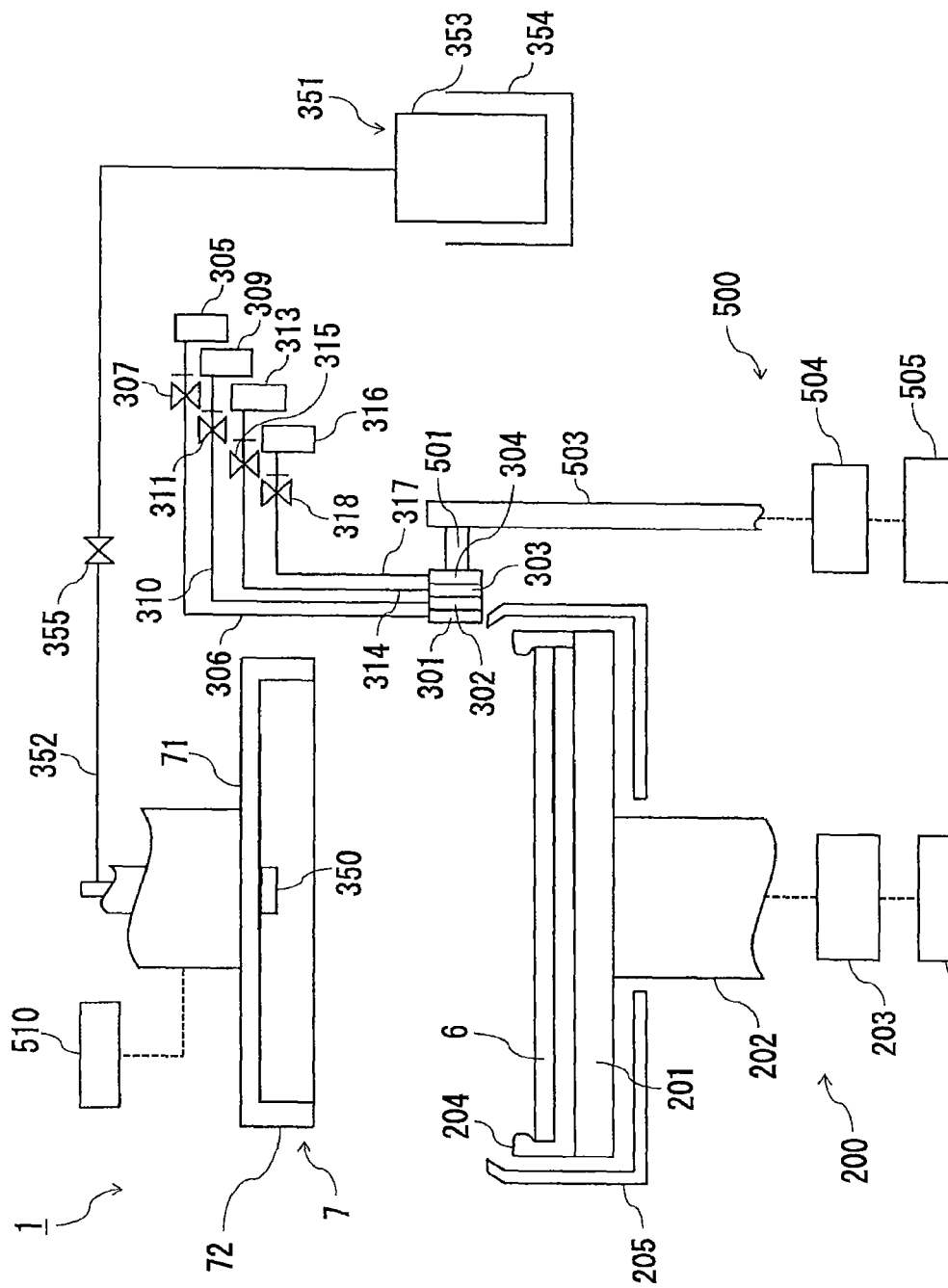
FIG. 9 is a diagram of a substrate processing apparatus according to a third embodiment.

FIG. 9 is a diagram of the substrate processing apparatus 1 according to the third embodiment. As shown in FIG. 9, the substrate processing apparatus 1 according to the third embodiment further includes a seventh nozzle 350 as an example of a third supplier, in addition to the configuration of the substrate processing apparatus 1 in FIG. 1.

The seventh nozzle 350 is connected to a vapor supply source 351 via a vapor supply pipe 352. The vapor supply source 351 has a solvent tank 353 storing therein the second solvent and a solvent heater 354 for heating the second solvent. The second solvent heated by the solvent heater 354 is evaporated to a vapor. The vapor supply pipe 352 is provided with a vapor supply valve 355 that adjusts a flow rate of the vapor of the second solvent. The seventh nozzle 350 discharges the vapor of the second solvent supplied from the vapor supply source 351 to the surface of the semiconductor substrate 6 to which the sublimation material containing liquid has been supplied.

An end of the vapor supply pipe 352 is connected to an opposed plate 7 that is opposed to the surface of the semiconductor substrate 6. The seventh nozzle 350 communicates with the end of the vapor supply pipe 352 at a center of the opposed plate 7. The opposed plate 7 has a top plate 71 having a circular flat shape coaxial with the stage 201 and an outer circumferential wall 72 having a cylindrical shape extending downward from an outer circumferential edge of the top plate 71. The seventh nozzle 350 is movable between a position opposed to the center portion of the surface of the semiconductor substrate 6 and a position upward away from the surface of the semiconductor substrate 6. The seventh nozzle 350 is moved integrally with the opposed plate 7 by a moving device 510.

Figure 10:
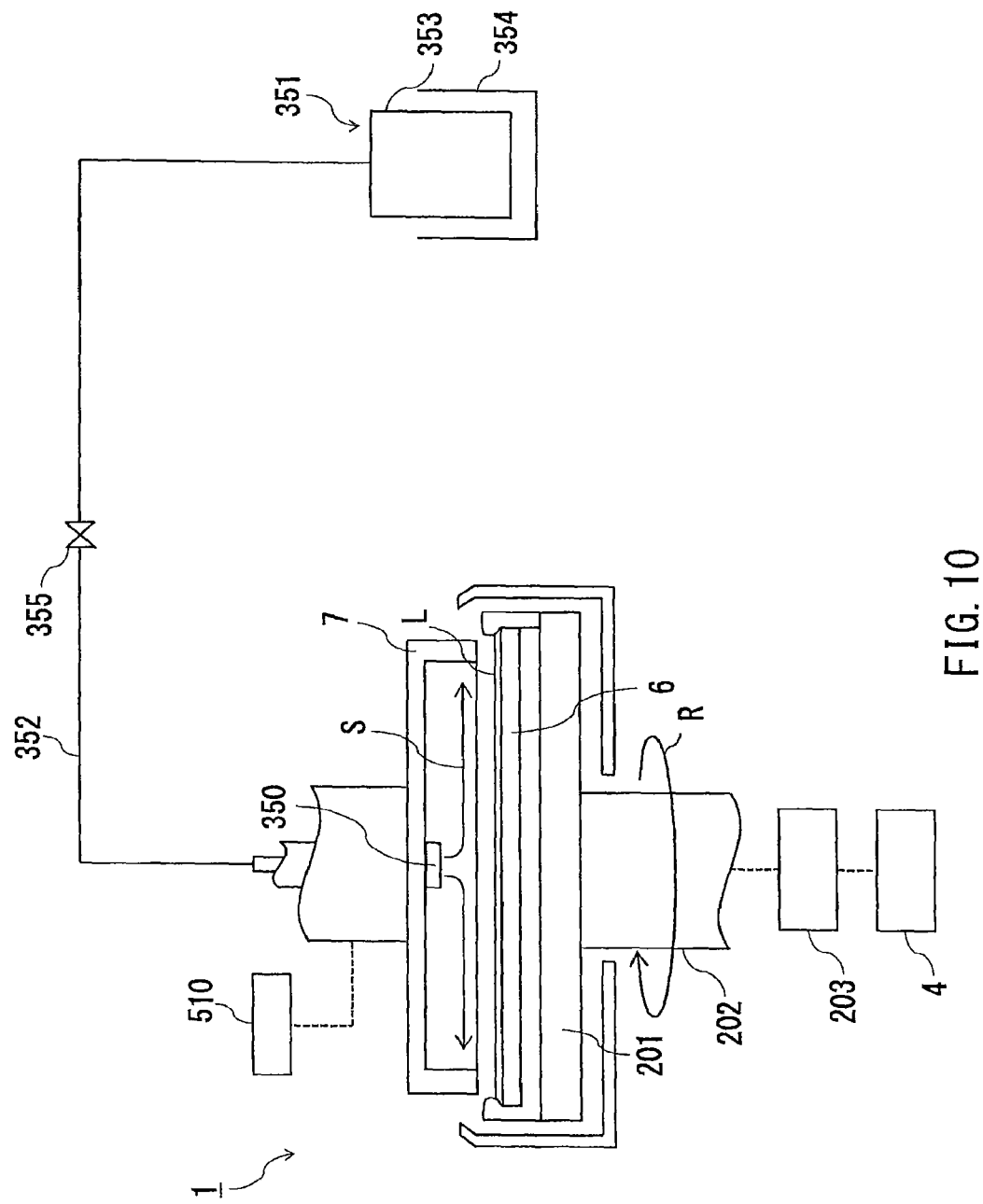
FIG. 10 is a diagram showing a vapor supply operation by the substrate processing apparatus according to the third embodiment.

FIG. 10 is a diagram showing a vapor supply operation by the substrate processing apparatus 1 according to the third embodiment. As shown in FIG. 10, the seventh nozzle 350 brings a vapor S of the second solvent into contact with the sublimation material containing liquid at a position opposed to the semiconductor substrate 6. Further, the opposed plate 7 covers a space above the semiconductor substrate 6. Therefore, it is possible to bring the vapor S of the second solvent into contact with the entirety of the sublimation material containing liquid L. This contact of the second solvent with the sublimation material containing liquid L is performed in the precipitation process (Step S5 in FIG. 2).

According to the third embodiment, it is possible to eliminate an association state in a sublimation material containing liquid by bringing the vapor S of a second solvent into contact with the sublimation material containing liquid L. Accordingly, unevenness of film formation can be suppressed similarly to the first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A substrate processing method for drying a substrate, comprising:
   supplying a solution in which a sublimation material is dissolved in a first solvent to a surface of a cleaned substrate;
   eliminating at least a portion of association states of the sublimation material;
   precipitating the sublimation material on the surface of the substrate; and
   removing the precipitated sublimation material by sublimation, wherein
   the supplying the solution is performed while the substrate is rotated, and
   the eliminating the association states comprises repeatedly increasing and decreasing a rotation acceleration of the substrate to apply a shear force to the solution.

2. The method of claim 1, wherein the eliminating the association states comprises adding a second solvent different from the first solvent to the solution.

3. The method of claim 1, wherein the eliminating the association states comprises adding a second solvent different from the first solvent to the solution.

4. The method of claim 1, wherein the eliminating the association states comprises bringing a vapor of a second solvent different from the first solvent into contact with the solution.

5. The method of claim 1, wherein the eliminating the association states comprises bringing a vapor of a second solvent different from the first solvent into contact with the solution.

6. The method of claim 2, wherein the eliminating the association states comprises bringing a vapor of a second solvent different from the first solvent into contact with the solution.

7. The method of claim 1, wherein a state where the association states have been eliminated is maintained by bringing a vapor of a third solvent capable of dissolving the sublimation material into contact with the solution.

8. The method of claim 1, wherein a state where the association states have been eliminated is maintained by bringing a vapor of a third solvent capable of dissolving the sublimation material into contact with the solution.

9. The method of claim 2, wherein a state where the association states have been eliminated is maintained by bringing a vapor of a third solvent capable of dissolving the sublimation material into contact with the solution.

10. The method of claim 1, further comprising
    supplying an inert gas onto the surface of the substrate, wherein
    the supplying the inert gas is performed at a flow speed that suppresses a vapor concentration of the first solvent on the surface of the substrate to be less than a predetermined concentration.

11. The method of claim 2, wherein the eliminating the association states comprises adding water to the solution to change a surface tension of the solution by a range of 1% to 10%.

12. The method of claim 10, wherein the predetermined concentration is 1200 ppm, and a flow speed of the inert gas is less than 0.8 nals.

13. The method of claim 1, wherein the surface of the substrate with a convex pattern formed thereon is dried.

14. The method of claim 1, wherein the eliminating the association states is performed after the supplying of the solution is finished.

15. A substrate processing apparatus comprising:
- a first supplier supplying a solution in which a sublimation material is dissolved in a first solvent, to a surface of a cleaned substrate;
- an association eliminator eliminating at least a portion of association states of the sublimation material;
- a precipitator precipitating the sublimation material on the surface of the substrate; and
- a rotator rotating the substrate while holding the substrate horizontally, wherein
- the association eliminator comprises a first controller repeatedly increasing and decreasing a rotation acceleration of the rotator to apply a shear force to the solution.

16. The apparatus of claim 15, wherein the association eliminator comprises a second supplier supplying a second solvent different from the first solvent onto the surface of the substrate.

17. The apparatus of claim 15, wherein the association eliminator comprises a third supplier supplying a vapor of a second solvent different from the first solvent onto the surface of the substrate.

18. The apparatus of claim 15, further comprising a fourth supplier supplying a vapor of a third solvent capable of dissolving the sublimation material onto the surface of the substrate.

19. The apparatus of claim 15, further comprising a fifth supplier supplying an inert gas onto the surface of the substrate, wherein
- the fifth supplier supplies the inert gas at a flow speed that suppresses a vapor concentration of the first solvent on the surface of the substrate to be less than a predetermined concentration.

20. The apparatus of claim 15, wherein the association eliminator eliminates the association states after the supplying of the solution is finished.

* * * * *